(12) United States Patent
Iwamoto

(10) Patent No.: US 12,002,779 B2
(45) Date of Patent: Jun. 4, 2024

(54) MULTILAYER BODY AND METHOD OF MANUFACTURING THE SAME

(71) Applicant: Murata Manufacturing Co., Ltd., Nagaokakyo (JP)

(72) Inventor: Takashi Iwamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 610 days.

(21) Appl. No.: 17/203,850

(22) Filed: Mar. 17, 2021

(65) Prior Publication Data

US 2021/0203302 A1 Jul. 1, 2021

Related U.S. Application Data

(63) Continuation of application No. PCT/JP2019/034548, filed on Sep. 3, 2019.

(30) Foreign Application Priority Data

Sep. 28, 2018 (JP) ................. 2018-183240

(51) Int. Cl.
*H01L 23/00* (2006.01)
*H01L 21/56* (2006.01)
(Continued)

(52) U.S. Cl.
CPC ............ *H01L 24/14* (2013.01); *H01L 21/561* (2013.01); *H01L 21/568* (2013.01);
(Continued)

(58) Field of Classification Search
CPC ............ H01L 23/5389; H01L 2224/96; H01L 2224/04105; H01L 25/043; H01L 25/0657; H01L 25/074; H01L 25/0756; H01L 25/117; H01L 25/165; H01L 2225/06527; H01L 2225/06555; H03H 9/0557;
(Continued)

(56) References Cited

U.S. PATENT DOCUMENTS

| | | | |
|---|---|---|---|
| 2012/0020026 A1 | 1/2012 | Oganesian et al. | |
| 2015/0207050 A1 | 7/2015 | Tsukada et al. | |
| 2019/0295945 A1 | 9/2019 | Iwamoto | |

FOREIGN PATENT DOCUMENTS

| | | | |
|---|---|---|---|
| JP | 2009-099637 A | 5/2009 | |
| JP | 2016-201565 A | 12/2016 | |

(Continued)

OTHER PUBLICATIONS

Official Communication issued in International Patent Application No. PCT/JP2019/034548, dated Nov. 26, 2019.

*Primary Examiner* — David A Zarneke
(74) *Attorney, Agent, or Firm* — Keating & Bennett, LLP

(57) ABSTRACT

A multilayer body includes a first electronic component and a structural body including first and second regions. The first electronic component is in the second region. The multilayer body includes a second electronic component mounted via a solder bump onto the structural body with a connection pad interposed therebetween. An outer surface of the first region and an outer surface of the first electronic component have a step difference therebetween in a height direction of the structural body. The connection pad is on the outer surface of the first region, an outer surface of the first electronic component, and a step-difference surface of a portion of the step difference.

16 Claims, 13 Drawing Sheets

(51) Int. Cl.
  *H01L 23/538* (2006.01)
  *H01L 25/00* (2006.01)
  *H01L 25/065* (2023.01)
  *H01L 25/18* (2023.01)
  *H03H 3/08* (2006.01)
  *H03H 9/05* (2006.01)

(52) U.S. Cl.
  CPC .......... *H01L 23/5389* (2013.01); *H01L 24/05* (2013.01); *H01L 24/06* (2013.01); *H01L 24/16* (2013.01); *H01L 24/17* (2013.01); *H01L 25/0657* (2013.01); *H01L 25/18* (2013.01); *H01L 25/50* (2013.01); *H01L 24/03* (2013.01); *H01L 2224/02379* (2013.01); *H01L 2224/02381* (2013.01); *H01L 2224/04105* (2013.01); *H01L 2224/05569* (2013.01); *H01L 2224/06155* (2013.01); *H01L 2224/14155* (2013.01); *H01L 2224/16145* (2013.01); *H01L 2224/17055* (2013.01); *H01L 2225/06513* (2013.01); *H01L 2225/06517* (2013.01); *H01L 2225/06524* (2013.01); *H01L 2225/06527* (2013.01); *H01L 2225/06548* (2013.01); *H01L 2225/06555* (2013.01); *H03H 3/08* (2013.01); *H03H 9/0557* (2013.01); *H03H 9/059* (2013.01)

(58) Field of Classification Search
  CPC .... H03H 9/0576; H03H 9/059; H03H 9/1064; H03H 9/1085
  See application file for complete search history.

(56) References Cited

FOREIGN PATENT DOCUMENTS

| | | |
|---|---|---|
| WO | 2013/168223 A1 | 11/2013 |
| WO | 2018/096830 A1 | 5/2018 |
| WO | 2018/116799 A1 | 6/2018 |

HEIGHT DIRECTION

MULTILAYER BODY AND METHOD OF MANUFACTURING THE SAME

CROSS REFERENCE TO RELATED APPLICATIONS

This application claims the benefit of priority to Japanese Patent Application No. 2018-183240 filed on Sep. 28, 2018 and is a Continuation Application of PCT Application No. PCT/JP2019/034548 filed on Sep. 3, 2019. The entire contents of each application are hereby incorporated herein by reference.

BACKGROUND OF THE INVENTION

1. Field of the Invention

The present invention relates to a multilayer body provided by connecting multiple electronic components using solder bumps.

2. Description of the Related Art

Various types of multilayer bodies have been in practical use. For example, a multilayer body described in Japanese Unexamined Patent Application Publication No. 2016-201565 is formed by mounting an electronic component using solder bumps onto terminals of a structural body that includes another electronic component therein.

With the configuration described in Japanese Unexamined Patent Application Publication No. 2016-201565, the solder bumps of the electronic component to be mounted are connected to the terminals of the structural body. In the case of the area of the connection portion being small, the connection strength may not be large enough, and repeated thermal stress or the like may lead to breakage of the connection portion. On the other hand, increasing the area of the connection portion between the terminals of the structural body and the electronic component leads to an increase in the size of the multilayer body.

A problem is to improve connection strength for a multilayer body while decreasing the size of the multilayer body.

SUMMARY OF THE INVENTION

Preferred embodiments of the present invention provide multilayer bodies each with improved connection strength and a decreased size.

A multilayer body according to a preferred embodiment of the present invention includes a first electronic component and a structural body including a first region and a second region. The first electronic component is in the second region. The multilayer body further includes a second electronic component that is mounted via a solder bump onto the structural body with a connection pad interposed therebetween. In the multilayer body, a step difference in a height direction of the structural body is provided between an outer surface of the first region and an outer surface of the second region. The connection pad is provided on the outer surface of the first region, the outer surface of the first electronic component, and a step-difference surface of a portion of the step difference.

With this configuration, the surface area of the connection pad becomes larger compared with the case in which the first region and the second region are flush with each other. An increase in the area of the connection portion between the first electronic component and the second electronic component increases the connection strength of the multilayer body including the first electronic component and the second electronic component. The increase in the area of the connection portion is provided due to the portion of step difference between the first region and the second region. This reduces or prevents an increase in the area of the structural body when the structural body is viewed in plan, which results in a reduction in the size of the multilayer body.

A method of manufacturing a multilayer body according to a preferred embodiment of the present invention includes disposing a first electronic component on an outer surface of a support substrate with a temporary fixation member interposed therebetween, sealing the temporary fixation member and the first electronic component with a resin, removing the support substrate and the temporary fixation member, forming a connection pad such that the connection pad straddles a surface of a layer of the resin on which the support substrate has been disposed and a surface of the first electronic component on which the temporary fixation member has been disposed, and mounting a second electronic component onto the connection pad using a solder bump.

With this method, a multilayer body as described above can be manufactured easily and accurately.

Another method of manufacturing a multilayer body according to a preferred embodiment of the present invention includes burying a portion of a first electronic component in a temporary fixation member disposed on an outer surface of a support substrate, sealing the temporary fixation member and the first electronic component with a resin, removing the support substrate and the temporary fixation member, forming a connection pad such that the connection pad straddles a surface of a layer of the resin on which the support substrate has been disposed and a surface of the first electronic component on which the temporary fixation member has been disposed, and mounting a second electronic component onto the connection pad using a solder bump.

With this method, a multilayer body as described above can be manufactured easily and accurately.

According to preferred embodiments of the present invention, the sizes of multilayer bodies can be reduced while improving the connection strength of the multilayer bodies.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below with reference to the drawings.

First Preferred Embodiment

Figure 1A:
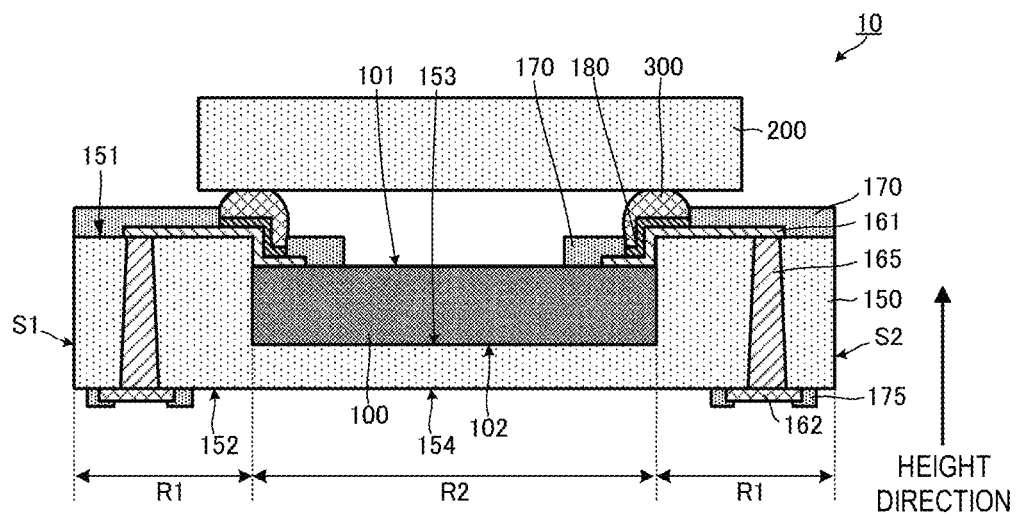
FIG. 1A is a cross-sectional side view illustrating a configuration of a multilayer body 10 according to a first preferred embodiment of the present invention.
Figure 1B:
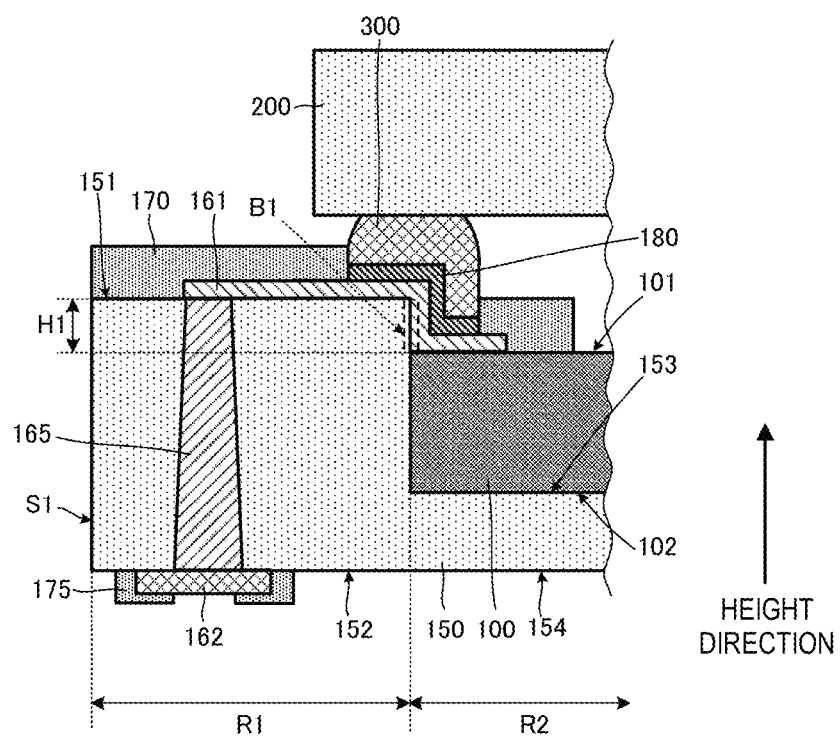
FIG. 1B is an enlarged cross-sectional side view illustrating a portion of the multilayer body 10 of FIG. 1A.
Figure 2:
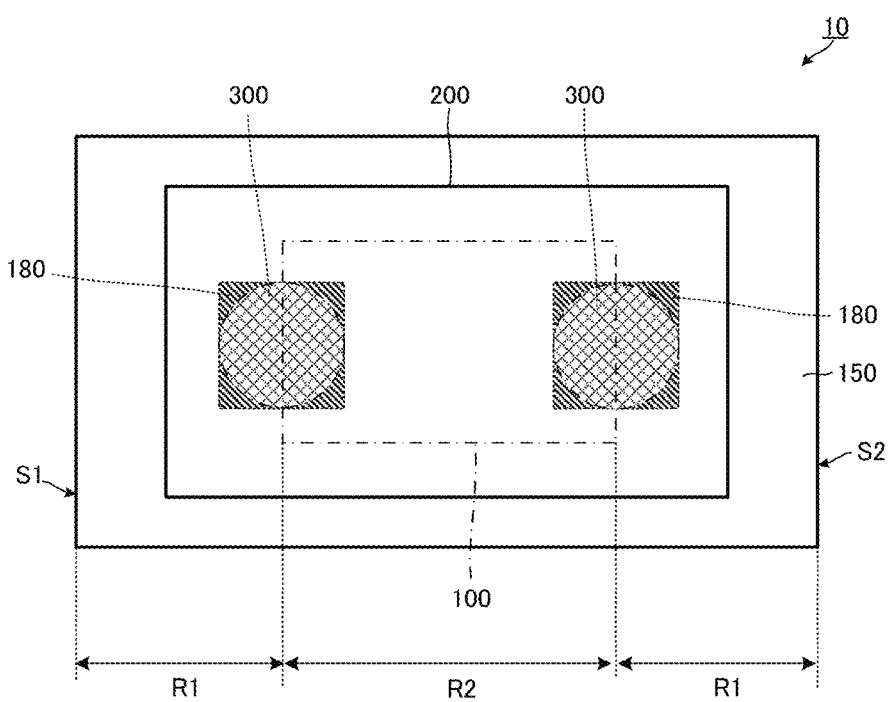
FIG. 2 is a plan view illustrating the multilayer body according to the first preferred embodiment of the present invention when an outer surface thereof is viewed.
Figure 3:
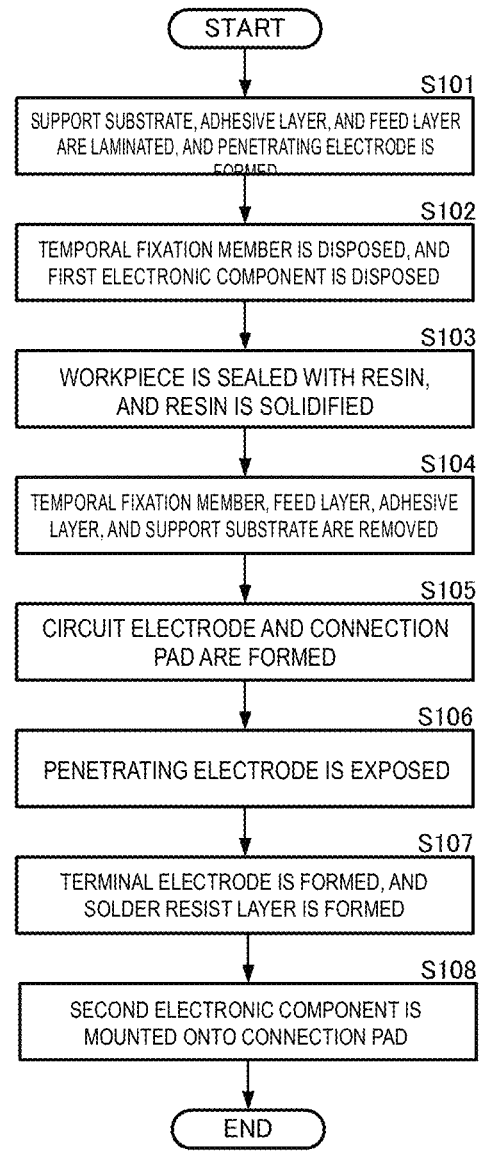
FIG. 3 is a flow chart illustrating a method of manufacturing the multilayer body 10 according to the first preferred embodiment of the present invention.

A multilayer body according to a first preferred embodiment of the present invention will be described with reference to the drawings. FIG. 1A is a cross-sectional side view illustrating a configuration of a multilayer body 10 according to the first preferred embodiment of the present invention, and FIG. 1B is an enlarged cross-sectional side view illustrating a portion of the multilayer body 10 of FIG. 1A. FIG. 2 is a plan view illustrating the multilayer body 10 according to the first preferred embodiment of the present invention when an outer surface thereof is viewed. FIG. 3 is a flow chart illustrating a method of manufacturing the multilayer body 10 according to the first preferred embodiment of the present invention. FIGS. 4A to 4D are cross-sectional side views illustrating the method of manufacturing the multilayer body 10 according to the first preferred embodiment of the present invention. FIGS. 5A to 5C are cross-sectional side views illustrating the method of manufacturing the multilayer body 10 according to the first preferred embodiment of the present invention. In the drawings, the relationship between vertical and horizontal dimensions may be exaggerated and may not always reflect actual dimensions.

Structure of Multilayer Body

As illustrated in FIG. 1A, the multilayer body 10 includes a first electronic component 100, a structural body 150, circuit electrodes 161, terminal electrodes 162, penetrating electrodes 165, solder resist layers 170 and 175, connection pads 180, a second electronic component 200, and solder bumps 300.

The first electronic component 100 is disposed in the structural body 150. The second electronic component 200 is mounted, using solder bumps 300, onto the connection pads 180 provided at the structural body 150. Detailed arrangement and mounting configurations will be described later. The connection pads 180 are preferably made, for example, of Ni, Au, Pt, or Pd.

The first electronic component 100 includes principal surfaces 101 and 102 that extend perpendicular or substantially perpendicular to the height direction that is indicated by the bold arrow in FIG. 1A. The principal surfaces 101 and 102 are opposite to each other. The principal surface 101 corresponds to an "outer surface of the first electronic component".

For example, the first electronic component 100 and the second electronic component 200 have cuboid shapes and may be an IC device using a semiconductor substrate, a surface acoustic wave (SAW) filter using a piezoelectric substrate, or the like, for example.

The structural body 150 is preferably made of a resin, for example. As viewed in plan, the structural body 150 includes a first region R1 and a second region R2. The second region R2 is surrounded by the first region R1. The first region R1 includes principal surfaces 151 and 152 that extend perpendicular or substantially perpendicular to the height direction and are opposite to each other. The principal surface 151 corresponds to an "outer surface of the first region". The second region R2 includes principal surfaces 153 and 154 that extend perpendicular or substantially perpendicular to the height direction and are opposite to each other. The structural body 150 also includes a first side surface S1 and a second side surface S2 that extend parallel or substantially parallel to the height direction and are opposite to each other.

The principal surface 152 of the first region R1 is flush with the principal surface 154 of the second region R2. The principal surface 151 of the first region R1 is positioned above the principal surface 153 of the second region R2 in the height direction. Here, the height difference between the principal surface 151 and the principal surface 153 is greater than the height of the first electronic component 100.

The first region R1 of the structural body 150 has the following structure. The penetrating electrodes 165 are provided inside the structural body 150 in the first region R1. The circuit electrodes 161 are provided at the principal surface 151. The terminal electrodes 162 are provided at the principal surface 152. The circuit electrodes 161 are connected to respective terminal electrodes 162 via the penetrating electrodes 165. A solder resist layer 175 covers a portion of each terminal electrode 162.

The second region R2 of the structural body 150 has the following structure. The first electronic component 100 is disposed in the second region R2. The first electronic component 100 is disposed such that a principal surface 102 of the first electronic component 100 is in contact with the principal surface 153 of the structural body 150, or disposed such that the principal surface 102 of the first electronic component 100 is in contact with the principal surface 153 of the structural body 150 with an insulation layer and a conducting metal element interposed therebetween.

As illustrated in FIG. 1B, the principal surface 151 of the first region R1 is positioned above the principal surface 101 of the first electronic component 100 in the height direction. More specifically, the principal surface 101 and the principal surface 151 are disposed so as to have a step difference H1 in the height direction.

The "step difference" as used herein is referred to the height difference between the principal surface 101 and the principal surface 151 in the height direction, and the shape of a portion of the step difference is not specifically limited here. Note that in structures described herein, any height difference provided by multiple flat surfaces or any height difference between a higher position and a lower position are hereinafter described as the "step difference".

Each circuit electrode 161 extends, without interruption, from the principal surface 151 to the principal surface 101 of the first electronic component 100. In other words, the circuit electrode 161 crosses a step-difference surface B1 that connects the principal surface 151 of the structural body 150 to the principal surface 101 of the first electronic component 100. Note that the step-difference surface B1 is a side surface of the first region R1 that faces the second region R2 in the structural body 150, in other words, that is exposed in a direction toward the principal surface 101 of the second region R2 when the circuit electrodes 161 and the connection pads 180 are removed from the structural body 150. In other words, the step-difference surface B1 has the step difference H1.

Each connection pad 180 is provided on a surface of the circuit electrode 161 that is opposite to the surface facing the structural body 150, in other words, that is opposite to the surface in contact with the principal surface 151, the principal surface 101 of the first electronic component 100, and the step-difference surface B1.

The second electronic component 200 is mounted onto the connection pads 180 with respective solder bumps 300 interposed therebetween. The solder bumps 300 are connected to respective connection pads 180 so as to cover a portion of the step-difference surface B1.

As described above, the principal surface 101 and the principal surface 151 are disposed so as to have the step difference H1. Accordingly, each connection pad 180 can be made larger approximately to the extent of the area of the step-difference surface B1 compared with the case in which the principal surface 101 and the principal surface 151 are flush with each other. This can increase the area of the connection pad 180 to be connected with the solder bump 300 (hereinafter referred to as the "connection area").

The multilayer body 10 has a structure in which the principal surface 101 is positioned blow the principal surface 151 and the portion of the connection pad 180 in contact with the step-difference surface B1 faces the center of the multilayer body 10 (the second region R2 of the structural body 150). In other words, the multilayer body 10 has a structure in which the central region of the multilayer body 10 is recessed and positioned below the peripheral region (the first region R1 of the structural body 150). Due to thermal stress, forces may act between the structural body 150 and the second electronic component 200 so as to expand the second electronic component 200 in the direction perpendicular or substantially perpendicular to the height direction with respect to the principal surface 151 of the structural body 150. In other words, forces may act in the second electronic component 200 in directions from the center of the multilayer body 10 toward the peripheral region. In this case, each solder bump 300 is pressed against the step-difference surface B1 (a portion indicated by the step difference H1) and also against the portion of the connection pad 180 that is in contact with the step-difference surface B1. This can increase the connection strength between the connection pad 180 and the solder bump 300, which reduces or prevents the likelihood of breakage.

More specifically, FIG. 2 is a plan view that illustrates a side of the multilayer body 10 on which the second electronic component 200 is mounted, in other words, a side of the multilayer body 10 including the principal surface 101 (the principal surface 151) of the multilayer body 10. The first electronic component 100 overlaps the second electronic component 200 as viewed in plan. Note that in FIG. 2, only the connection pads 180 and the solder bumps 300 are illustrated with other elements being omitted in order to clarify the orientation of the portion of step difference H1.

The solder bumps 300 straddle the first region R1 and the second region R2. Two solder bumps 300 are disposed at symmetrical positions with respect to the center of the multilayer body 10.

Regarding the left connection pad 180 (the connection pad 180 near the first side surface S1) in FIG. 2, the lower surface (the principal surface 101) is positioned, with respect to the portion of the step difference H1, farther in the direction from the first side surface S1 toward the second side surface S2 than the higher surface (the principal surface 151). On the other hand, regarding the right connection pad 180 (the connection pad 180 near the second side surface S2), the lower surface (the principal surface 101) is positioned, with respect to the portion of the step difference H1, farther in the direction from the second side surface S2 toward the first side surface S1 than the higher surface (the principal surface 151). Accordingly, when the second electronic component 200 expands, in other words, the forces act in the second electronic component 200 in directions from a central region of the multilayer body 10 toward the peripheral region, the solder bumps 300 and the connection pads 180 are pressed against the step-difference surface B1. This improves the connection strength between the solder bumps 300 and the corresponding connection pads 180.

In addition, as illustrated in FIG. 2, the portion of the step difference H1 (the step-difference surface B1) that extends in the height direction contributes to an increase in the connection area between the connection pad 180 and the solder bump 300. This can reduce or prevent an increase in the area of the connection pad 180 and the area of the solder bump 300 when the side on which the second electronic component 200 is mounted is viewed in plan, in other words, when the principal surface 101 (the principal surface 151) is viewed in plan. This leads to a reduction in the size of the multilayer body 10.

Method of Manufacturing Multilayer Body

FIG. 3 is a flow chart illustrating a method of manufacturing the multilayer body 10. The following describes a first non-limiting example method of manufacturing the multilayer body. FIG. 4A to 4D and FIGS. 5A to 5C are cross-sectional views illustrating shapes of the multilayer body 10 obtained at major manufacturing steps.

Figure 4A:
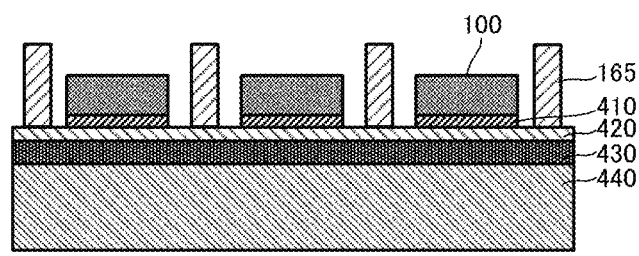
FIGS. 4A to 4D are cross-sectional side views illustrating the method of manufacturing the multilayer body 10 according to the first preferred embodiment of the present invention.
Figure 5A:
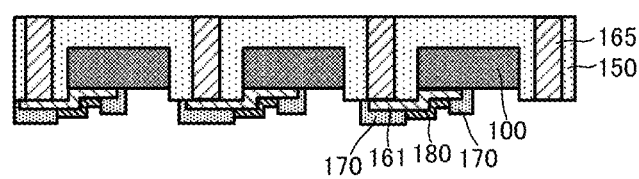
FIGS. 5A to 5C are cross-sectional side views illustrating the method of manufacturing the multilayer body 10 according to the first preferred embodiment of the present invention.
Figure 5B:
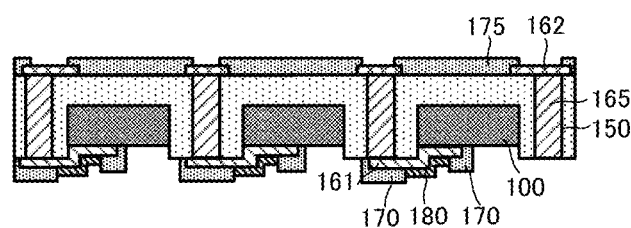
Figure 5C:
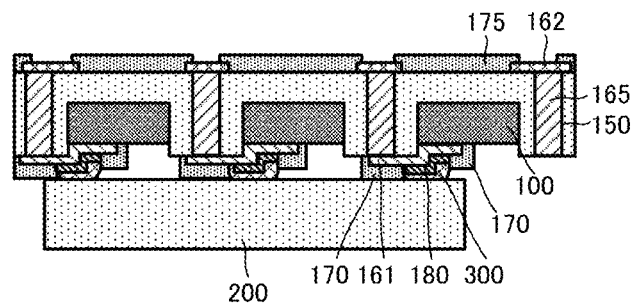

As illustrated in FIG. 3 and FIG. 4A, a support substrate 440, an adhesive layer 430, and a feed layer 420 are laminated in this order. Penetrating electrodes 165 are formed, using electroplating or the like, for example, on a surface of the feed layer 420 that is opposite to the surface on which the support substrate 440 is disposed (step S101).

Temporary fixation members 410 are disposed at positions between adjacent penetrating electrodes 165 on the surface of the feed layer 420 that is opposite to the surface on which the support substrate 440 is disposed, and first electronic components 100 are disposed on respective temporary fixation members 410 (step S102). Note that the temporary fixation members 410 are made of a material including a resin as a main ingredient, such as, for example, a polymeric resin or a resin containing a solvent.

Figure 4B:
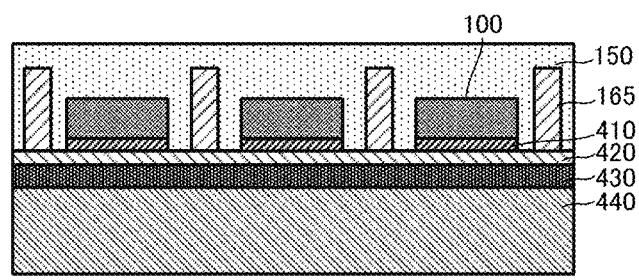

As illustrated in FIG. 3 and FIG. 4B, the surface of the feed layer 420, which is opposite to the surface on which the support substrate 440 is disposed, is sealed with a resin and the resin is solidified. Here, the penetrating electrodes 165, the temporary fixation members 410, and the first electronic components 100 are sealed with the resin to cover the penetrating electrodes 165, the temporary fixation members 410, and the first electronic components 100. As a result, the structural body 150 is formed where the temporary fixation members 410 are not present (step S103).

Figure 4C:
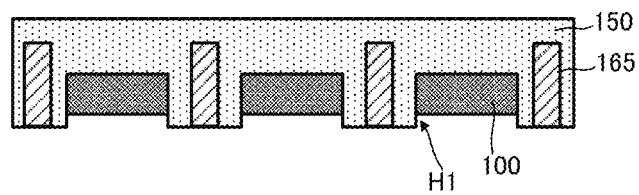

As illustrated in FIG. 3 and FIG. 4C, the temporary fixation members 410, the feed layer 420, the adhesive layer 430, and the support substrate 440 are removed (step S104). Portions of the step difference H1 are formed by removing the temporary fixation members 410. In other words, the step difference H1 is determined by the thickness of each temporary fixation member 410.

Figure 4D:
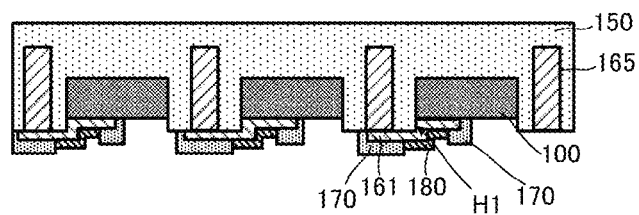

As illustrated in FIG. 3 and FIG. 4D, the circuit electrodes 161 are formed at ends of the penetrating electrodes 165 that are opposite to the ends at which the structural body 150 is formed. In other words, the circuit electrodes 161 are formed at the ends of the penetrating electrodes 165 where the temporary fixation members 410 are removed. The circuit electrodes 161 are formed so as to cross the portion of the step difference H1 (the portion having the step-difference surface B1). The connection pads 180 are subsequently formed so as to be in contact with respective circuit electrodes 161, in other words, so as to cross the portion of the step difference H1 (the portion having the step-difference surface B1) (step S105).

Note that a solder resist layer 170 may be formed, before or after the connection pad 180 is formed, on the structural body 150 and also on each circuit electrode 161 and the principal surface of each first electronic component 100 at a position near the circuit electrode 161.

For example, in the case of the solder resist layer 170 being formed before forming each connection pad 180, a portion of the solder resist layer 170 is removed from each circuit electrode 161, or more specifically, removed from the portion of the step difference H1 of each circuit electrode 161. Subsequently, the connection pad 180 is formed on the portion from which the solder resist layer 170 is removed. As a result, the connection pad 180 can be formed so as to cross the step-difference surface B1. In the case of the solder resist layer 170 being formed after forming each connection pad 180, the solder resist layer 170 is formed so as not to cover at least a portion of the connection pad 180. As a result, the connection pad 180 that crosses the step-difference surface B1 can be obtained.

As illustrated in FIG. 3 and FIG. 5A, the principal surface of the structural body 150 at which the first electronic component 100 is not disposed is shaved to expose the penetrating electrodes 165 (step S106).

As illustrated in FIG. 3 and FIG. 5B, the terminal electrodes 162 are formed so as to be in contact with respective penetrating electrodes 165. The solder resist layer 175 is formed so as to cover a portion of each terminal electrode 162 (step S107).

As illustrated in FIG. 3 and FIG. 5C, the second electronic component 200 is mounted onto the connection pads 180 with the solder bumps 300 interposed therebetween (step S108).

Thus, the multilayer body 10 can be reliably manufactured with high accuracy by using the manufacturing method described above.

Second Preferred Embodiment

Figure 6A:
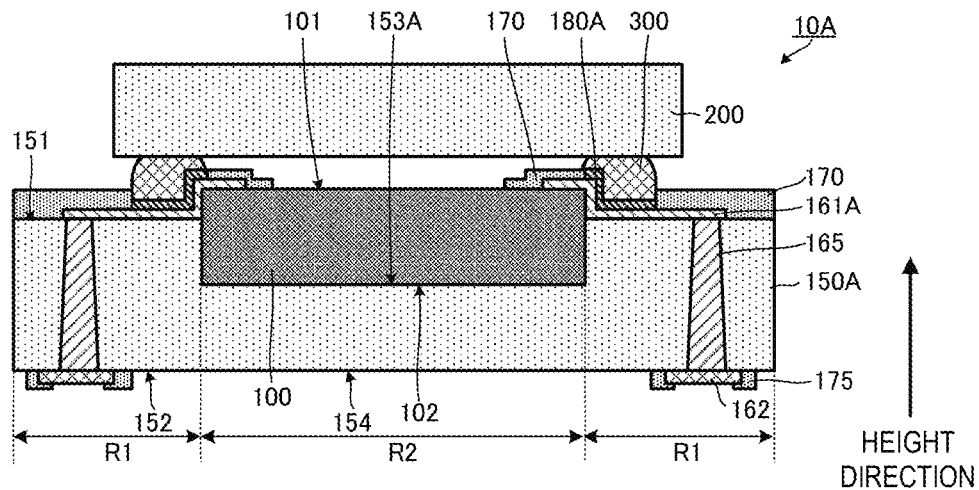
FIG. 6A is a cross-sectional side view illustrating a configuration of a multilayer body 10A according to a second preferred embodiment of the present invention.
Figure 6B:
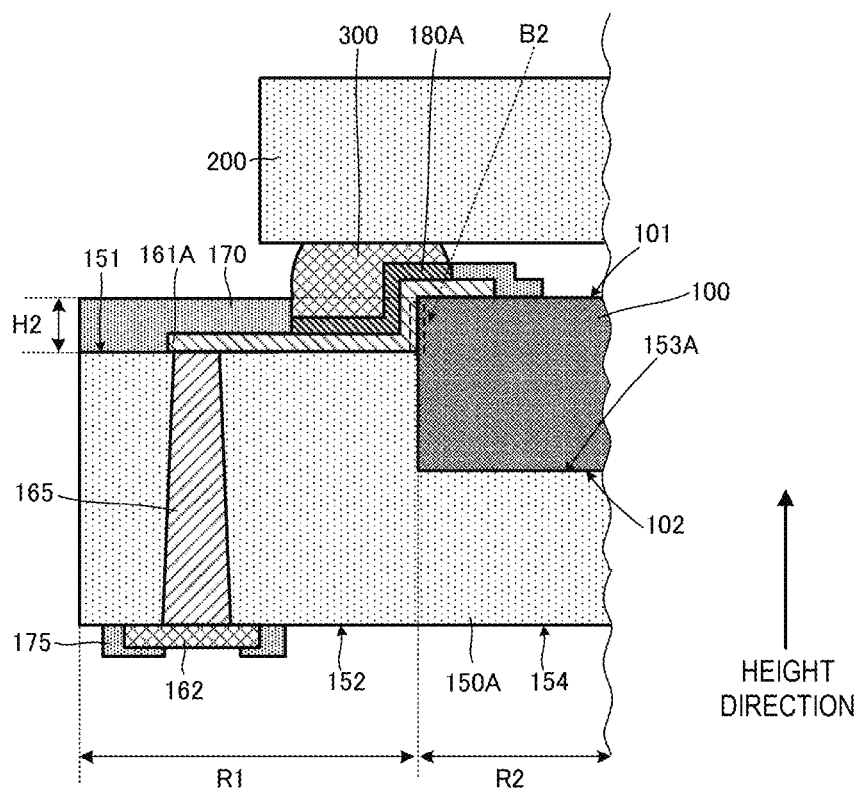
FIG. 6B is an enlarged cross-sectional side view illustrating a portion of the multilayer body 10A of FIG. 6A.
Figure 7:
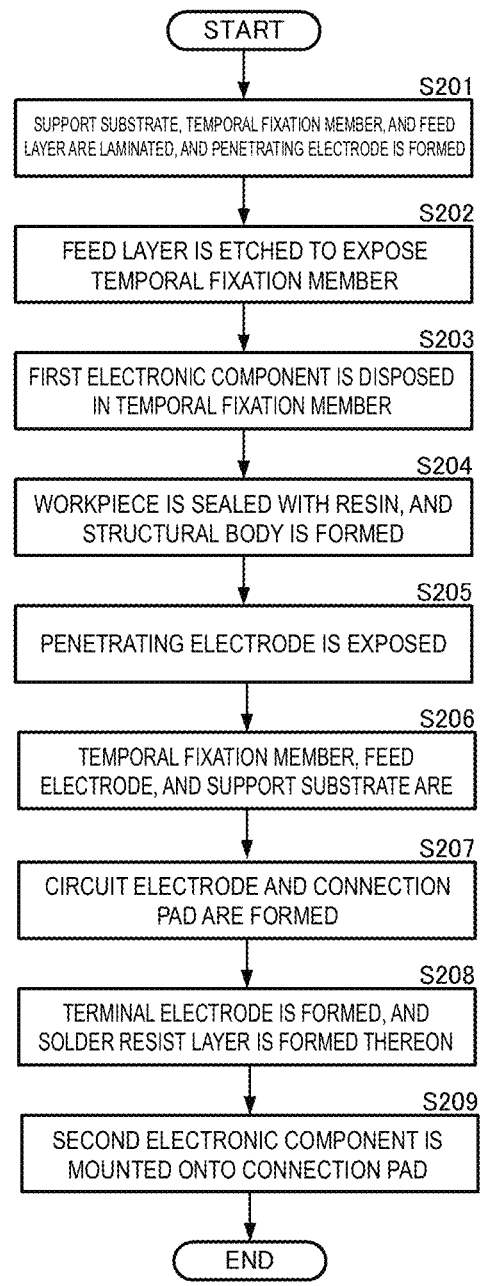
FIG. 7 is a flow chart illustrating a method of manufacturing the multilayer body 10A according to the second preferred embodiment of the present invention.

Next, a multilayer body according to a second preferred embodiment of the present invention will be described with reference to the drawings. FIG. 6A is a cross-sectional side view illustrating a configuration of a multilayer body 10A according to the second preferred embodiment of the present invention, and FIG. 6B is an enlarged cross-sectional side view illustrating a portion of the multilayer body 10A of FIG. 6A. FIG. 7 is a flow chart illustrating a non-limiting example of a method of manufacturing the multilayer body 10A. FIGS. 8A to 8D are cross-sectional side views illustrating the method of manufacturing the multilayer body 10A according to the second preferred embodiment of the present invention. FIGS. 9A to 9E are cross-sectional side views illustrating the method of manufacturing the multilayer body 10A according to the second preferred embodiment of the present invention. In the drawings, the relationship between vertical and horizontal dimensions may be exaggerated and may not always reflect actual dimensions.

Structure of Multilayer Body

As illustrated in FIGS. 6A and 6B, the multilayer body 10A of the second preferred embodiment is different from the multilayer body 10 of the first preferred embodiment in that the first electronic component 100 is disposed at a different position in the height direction indicated by the bold arrow in FIG. 6A and in that a portion of a step difference H2, circuit electrodes 161A, and connection pads 180A are shaped differently. Other basic configurations of the multilayer body 10A are the same as or similar to those of the multilayer body 10, and duplicated descriptions will be omitted.

The first region R1 includes principal surfaces 151 and 152 that are opposite to each other. The second region R2 includes principal surfaces 153A and 154 that are opposite to each other.

The principal surface 152 of the first region R1 is flush with the principal surface 154 of the second region R2. The principal surface 151 is positioned above the principal surface 153A in the height direction. The height difference between the principal surface 151 and the principal surface 153A is smaller than the height of the first electronic component 100.

The first electronic component 100 is disposed in the second region R2 of the structural body 150A. The first electronic component 100 overlaps the second electronic component 200 as viewed in plan. The first electronic component 100 is disposed such that the principal surface 102 of the first electronic component 100 is in contact with the principal surface 153A of the structural body 150A, or disposed such that the principal surface 102 of the first electronic component 100 is in contact with the principal surface 153A of the structural body 150A with an insulation layer and a conducting metal element being interposed therebetween. By disposing the first electronic component 100 on the principal surface 153A, the principal surface 151 is at a position lower than the principal surface 101 of the first electronic component 100. In short, the principal surface 101 is positioned higher than the principal surface 151.

More specifically, as illustrated in FIG. 6B, the principal surface 151 of the first region R1 is positioned below the principal surface 101 of the first electronic component 100 in the height direction. More specifically, the principal surface 101 and the principal surface 151 are disposed so as to have a step difference H2 in the height direction.

Circuit electrodes 161A extend, without interruption, from the principal surface 101 of the first electronic component 100 to the principal surface 151 of structural body 150A. In other words, the circuit electrodes 161A cross a step-difference surface B2. Note that the step-difference surface B2 is a side surface of the second region R2 that faces the first region R1 in the first electronic component 100, in other words, that is exposed in a direction toward the principal surface 151 of the first region R1 when the circuit electrodes 161A and the connection pads 180A are removed from the first electronic component 100. In other words, the step-difference surface B2 includes the step difference H2.

Each connection pad 180A is provided on a surface of each circuit electrode 161A that is opposite to the surface facing the structural body 150A, in other words, that is opposite to the surface in contact with the principal surface 101, the principal surface 151, and the step-difference surface B2.

The second electronic component 200 is mounted onto the connection pads 180A with respective solder bumps 300 interposed therebetween. The solder bumps 300 are connected to respective connection pads 180A so as to cover a portion of the step-difference surface B2.

As described above, the principal surface 101 and the principal surface 151 are disposed so as to have the step difference H2. Accordingly, each connection pad 180A can be larger approximately to the extent of the area of the step-difference surface B2 compared with the case in which the principal surface 101 and the principal surface 151 are flush with each other. This can increase the connection area between the connection pad 180A and the solder bump 300.

The multilayer body 10A has a structure in which the principal surface 101 is positioned above the principal surface 151 and the portion of the connection pad 180A in contact with the step-difference surface B2 faces the peripheral region of the multilayer body 10A (the first region R1 of the structural body 150A). In other words, the multilayer body 10A has a structure in which the central region of the multilayer body 10A (the second region R2 of the structural body 150A) is projected and positioned above the peripheral region. Due to thermal stress, forces may act between the structural body 150A and the second electronic component 200 so as to contract the second electronic component 200 in the direction perpendicular or substantially perpendicular to the height direction with respect to the principal surface 151 of the structural body 150A. In other words, forces may act in the second electronic component 200 in directions from the peripheral region of the multilayer body 10 toward the central region. In this case, each solder bump 300 is pressed against the step-difference surface B2 (the portion indicated by the step difference H2) and also against the portion of the connection pad 180A that is in contact with the step-difference surface B2. This can increase the connection strength between the connection pad 180A and the solder bump 300, which reduces or prevents the likelihood of breakage.

In addition, the portion of the step difference H2 (the step-difference surface B2) that extends in the height direction contributes to an increase in the connection area between the connection pad 180A and the solder bump 300. This can reduce or prevent an increase in the area of the connection pad 180A and the area of the solder bump 300 when the side on which the second electronic component 200 is mounted is viewed in plan, in other words, when the principal surface 101 (the principal surface 151) is viewed in plan. This results in a reduction in the size of the multilayer body 10A.

Method of Manufacturing Multilayer Body

FIG. 7 is a flow chart illustrating a method of manufacturing the multilayer body 10A. The following describes a second non-limiting example method of manufacturing the multilayer body. FIGS. 8A to 8E and FIGS. 9A to 9E are cross-sectional views illustrating shapes of the multilayer body 10A obtained in major manufacturing steps.

Figure 8A:
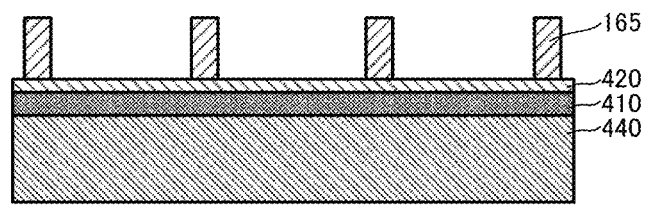
FIGS. 8A to 8D are cross-sectional side views illustrating the method of manufacturing the multilayer body 10A according to the second preferred embodiment of the present invention.

As illustrated in FIG. 7 and FIG. 8A, the support substrate 440, the temporary fixation member 410, and the feed layer 420 are laminated in this order. Penetrating electrodes 165 are formed, using electroplating or conductive-paste filling or the like, for example, on a surface of the feed layer 420 that is opposite to the surface on which the support substrate 440 is disposed (step S201). Here, the temporary fixation member 410 defines and functions also as the adhesive layer 430 that adheres the feed layer 420 and the support substrate 440 to each other.

Figure 8B:
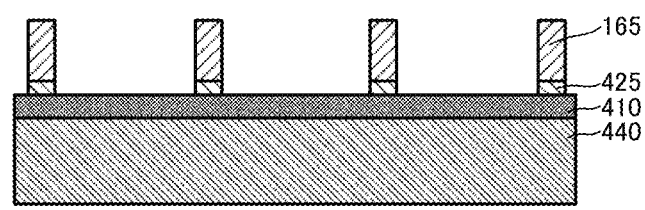

As illustrated in FIG. 7 and FIG. 8B, the feed layer 420 is etched to form feed electrodes 425 and to expose the temporary fixation member 410 in regions at which the first electronic components 100 are disposed (step S202).

Figure 8C:
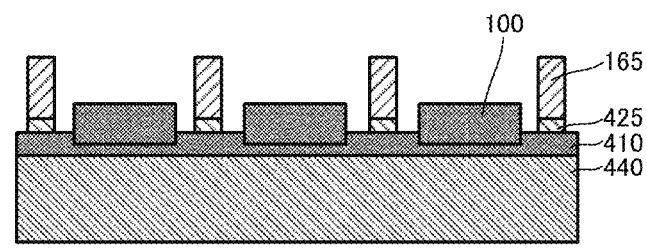

As illustrated in FIG. 7 and FIG. 8C, the first electronic components 100 are disposed in the regions at which the temporary fixation member 410 is exposed (step S203). Here, each first electronic component 100 is disposed such that the first electronic component 100 is buried to a predetermined depth in the temporary fixation member 410.

Figure 8D:
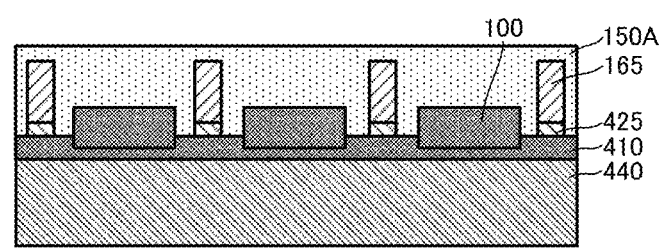

As illustrated in FIG. 7 and FIG. 8D, the surface of the temporary fixation member 410, which is opposite to the surface on which the support substrate 440 is disposed, is sealed with a resin and the resin is solidified (step S204). Here, the penetrating electrodes 165, the temporary fixation member 410, and the first electronic components 100 are sealed with the resin so as to cover these components. Thus, the structural body 150A is formed.

Figure 9A:
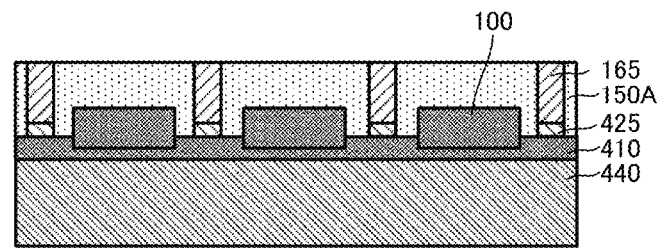
FIGS. 9A to 9E are cross-sectional side views illustrating the method of manufacturing the multilayer body 10A according to the second preferred embodiment of the present invention.

As illustrated in FIG. 7 and FIG. 9A, the principal surface of the structural body 150A, which is opposite to the surface at which the temporary fixation member 410 is disposed, is shaved to expose the penetrating electrodes 165 (step S205).

Figure 9B:
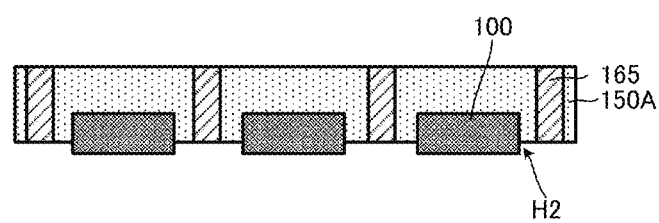

As illustrated in FIG. 7 and FIG. 9B, the temporary fixation member 410, the feed electrodes 425, and the support substrate 440 are removed (step S206). As described above, the first electronic component 100 is buried to a predetermined depth in the temporary fixation member 410. Accordingly, portions of the step difference H2 are formed by removing the temporary fixation member 410. In other words, the step difference H2 is determined by the buried depth of the first electronic component 100 in the temporary fixation member 410.

Figure 9C:
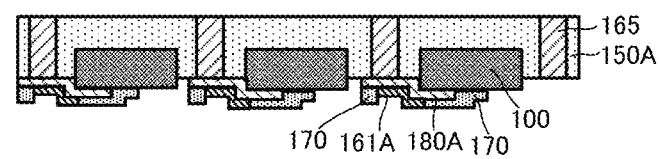

As illustrated in FIG. 7 and FIG. 9C, the circuit electrodes 161A are formed at ends of the penetrating electrodes 165 that are opposite to the ends at which the structural body 150A is formed. In other words, the circuit electrodes 161A are formed at the ends of the penetrating electrodes 165 where the temporary fixation member 410 is removed. The circuit electrodes 161A are formed so as to cross the portion of the step difference H2 (the portion having the step-difference surface B2). The connection pads 180A are subsequently formed so as to be in contact with respective circuit electrodes 161A, in other words, so as to cross the portion of the step difference H2 (the portion having the step-difference surface B2) (step S207).

Note that a solder resist layer 170 may be formed, before or after the connection pad 180 is formed, on the structural body 150A and also on each circuit electrode 161A and the principal surface of each first electronic component 100 at a position near the circuit electrode 161A.

For example, in the case of the solder resist layer 170 being formed before forming each connection pad 180A, a portion of the solder resist layer 170 is removed from each circuit electrode 161A, or more specifically, removed from the portion of the step difference H2 of each circuit electrode 161A. Subsequently, the connection pad 180A is formed on the portion from which the solder resist layer 170 is removed. As a result, the connection pad 180A can be formed so as to cross the step-difference surface B2. In the case of the solder resist layer 170 being formed after forming each connection pad 180A, the solder resist layer 170 is formed so as not to cover at least a portion of the connection pad 180A. As a result, the connection pad 180A that crosses the step-difference surface B2 can be obtained.

Figure 9D:
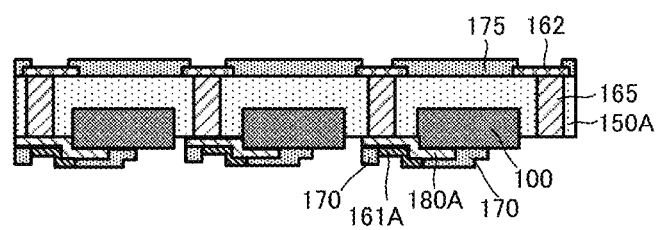

As illustrated in FIG. 7 and FIG. 9D, the terminal electrodes 162 are formed so as to be in contact with respective penetrating electrodes 165. The solder resist layer 175 is formed so as to cover a portion of each terminal electrode 162 (step S208).

Figure 9E:
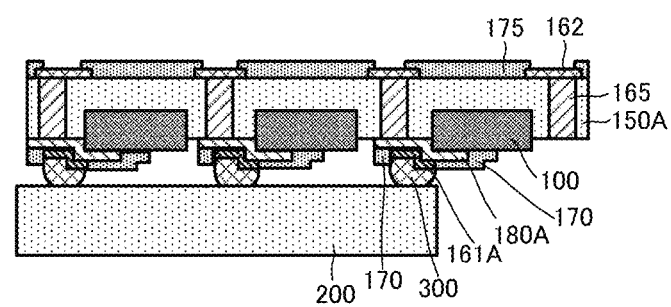

As illustrated in FIG. 7 and FIG. 9E, the second electronic component 200 is mounted onto the connection pads 180A with the solder bumps 300 interposed therebetween (step S209).

Thus, the multilayer body 10A can be reliably manufactured with high accuracy by using the manufacturing method described above.

Third Preferred Embodiment

Figure 10:
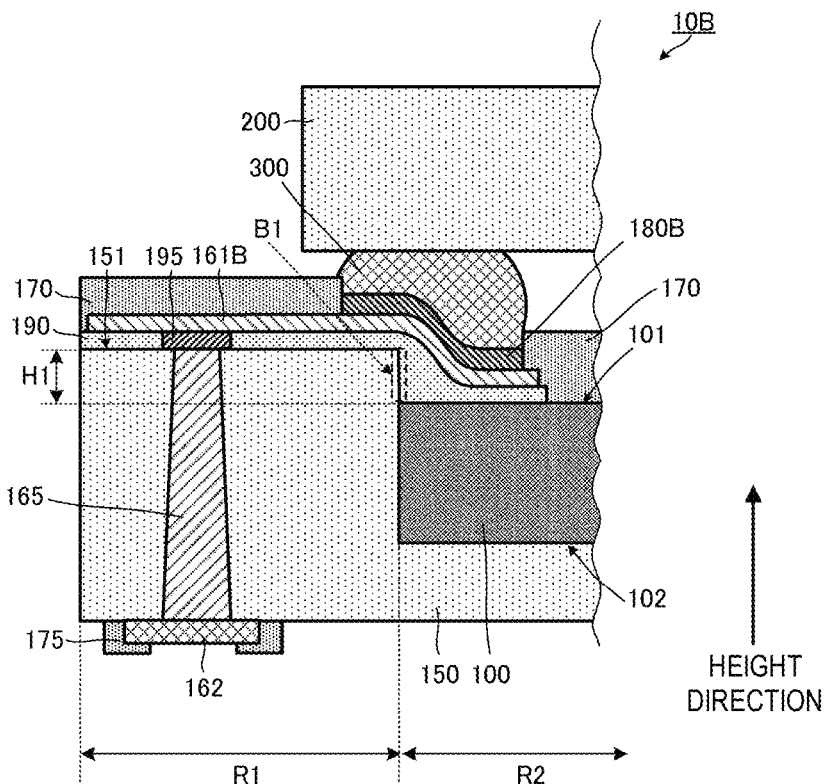
FIG. 10 is a cross-sectional side view illustrating a configuration of a multilayer body 10B according to a third preferred embodiment of the present invention.

Next, a multilayer body according to a third preferred embodiment of the present invention will be described with reference to the drawings. FIG. 10 is a cross-sectional side view illustrating a configuration of a multilayer body 10B according to the third preferred embodiment of the present invention. In FIG. 10, the relationship between vertical and horizontal dimensions is exaggerated and does not always reflect actual dimensions.

As illustrated in FIG. 10, the multilayer body 10B of the third preferred embodiment is different from the multilayer body 10 of the first preferred embodiment in that the multilayer body 10B includes resin films 190 and connection electrodes 195 and in that circuit electrodes 161B and connection pads 180B are shaped differently. Other basic configurations of the multilayer body 10B are the same as or similar to those of the multilayer body 10, and duplicated descriptions will be omitted.

As illustrated in FIG. 10, the multilayer body 10B includes the first electronic component 100, the structural body 150, the terminal electrodes 162, the circuit electrodes 161B, the penetrating electrodes 165, the solder resist layers 170 and 175, the connection pads 180B, the resin films 190, the connection electrodes 195, the second electronic component 200, and the solder bumps 300. The first electronic component 100 overlaps the second electronic component 200 as viewed in plan.

Each resin film 190 is provided continuously on the principal surface 151, the step-difference surface B1, and the principal surface 101.

In other words, the resin film 190 crosses the portion of the step difference H1. More specifically, the resin film 190 covers corners (sharp corners) between the step-difference surface B1 of the portion of the step difference H1 and the principal surface 151 and also between the step-difference surface B1 and the principal surface 101. The resin film 190 thus connects the principal surface 151 and the principal surface 101 to each other with a gentle slope or a gentle slope portion.

Each circuit electrode 161B covers a surface of the resin film 190 that is opposite to the surface facing the principal surfaces 151 and 101. Note that a connection electrode 195 extends through the resin film 190, and the circuit electrode 161B is connected to the corresponding penetrating electrode 165 via the connection electrode 195.

A connection pad 180B is provided on a surface of the circuit electrode 161B that is opposite to the surface facing the principal surface 101, the step-difference surface B1, and the principal surface 151. More specifically, the connection pad 180B is provided over the circuit electrode 161B and the resin film 190 so as to cover the slope surface that connects the structural body 150 to the first electronic component 100.

The second electronic component 200 is connected to the connection pads 180B with respective solder bumps 300 interposed therebetween.

Even in this configuration, the principal surface 101 and the principal surface 151 are disposed so as to have the step difference H1. In other words, each connection pad 180B can be larger compared with the case in which the principal surface 101 and the principal surface 151 are flush with each other, which can increase the connection area between each solder bump 300 and the connection pad 180B.

The resin film 190 covers corners (sharp corners) between the step-difference surface B1 of the portion of the step difference H1 and the principal surface 151 and also between the step-difference surface B1 and the principal surface 101, which prevents stress from concentrating in the solder bump 300. This can reduce or prevent the likelihood of breakage occurring inside the solder bump 300.

The multilayer body 10B has a structure in which the principal surface 101 is positioned below the principal surface 151, and the central region of the multilayer body 10B is recessed relative to the peripheral region. Due to thermal stress, forces may act between the structural body 150 and the second electronic component 200 so as to expand the second electronic component 200 in the direction perpendicular or substantially perpendicular to the height direction with respect to the principal surface 151 of the structural body 150. In this case, each solder bump 300 is pressed against the step-difference surface B1 (the portion indicated by the step difference H1). This can increase the connection strength between the connection pad 180B and the solder bump 300, which reduces or prevents the likelihood of breakage.

In addition, this can reduce or prevent an increase in the area of the multilayer body 10B when the side on which the second electronic component 200 is mounted is viewed in plan, in other words, when the principal surface 101 (the principal surface 151) is viewed in plan. This results in a reduction in the size of the multilayer body 10B.

Fourth Preferred Embodiment

Figure 11:
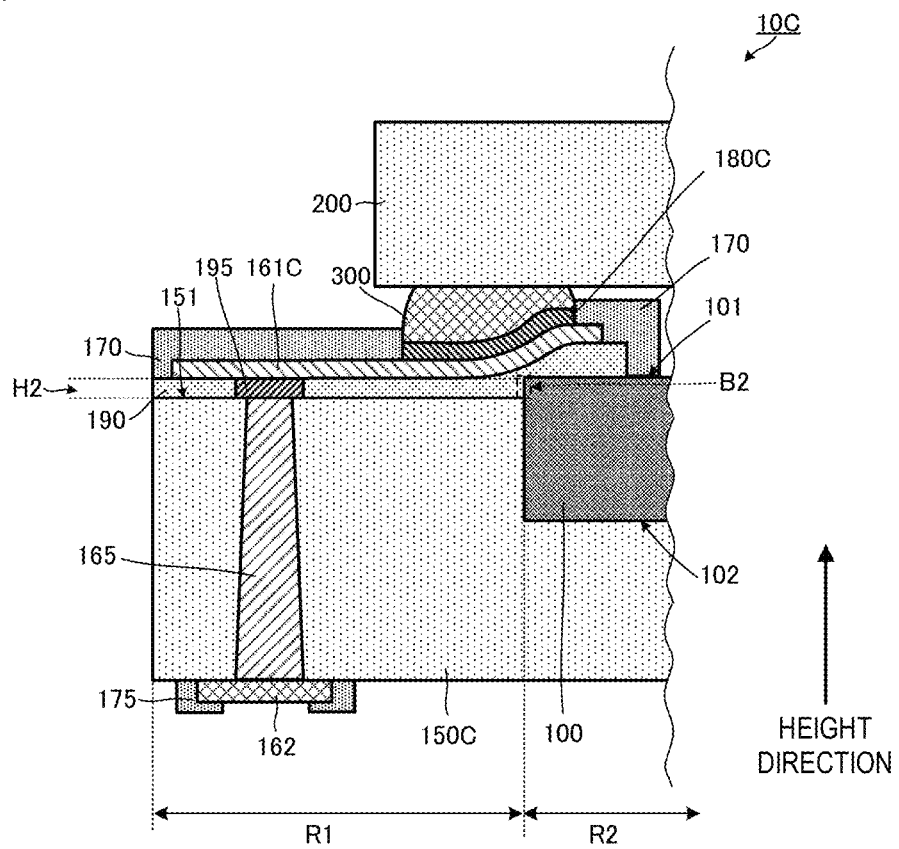
FIG. 11 is a cross-sectional side view illustrating a configuration of a multilayer body 10C according to a fourth preferred embodiment of the present invention.

Next, a multilayer body according to a fourth preferred embodiment of the present invention will be described with reference to the drawings. FIG. 11 is a cross-sectional side view illustrating a configuration of a multilayer body 10C according to the fourth preferred embodiment of the present invention. In FIG. 11, the relationship between vertical and horizontal dimensions is exaggerated and does not always reflect actual dimensions.

As illustrated in FIG. 11, the multilayer body 10C of the fourth preferred embodiment is different from the multilayer body 10A of the second preferred embodiment in that the multilayer body 10C includes resin films 190 and connection electrodes 195 and in that circuit electrodes 161C and connection pads 180C are shaped differently. Other basic configurations of the multilayer body 10C are the same as or similar to those of the multilayer body 10A, and duplicated descriptions will be omitted.

As illustrated in FIG. 11, the multilayer body 10C includes the first electronic component 100, a structural body 150C, the terminal electrodes 162, the circuit electrodes 161C, the penetrating electrodes 165, the solder resist layers 170 and 175, the connection pads 180C, the resin films 190, the connection electrodes 195, the second electronic component 200, and the solder bumps 300. The first electronic component 100 overlaps the second electronic component 200 as viewed in plan.

Each resin film 190 extends continuously on the principal surface 151, the step-difference surface B2, and the principal surface 101.

In other words, the resin film 190 crosses the portion of the step difference H2. More specifically, the resin film 190 covers corners (sharp corners) between the step-difference surface B2 of the portion of the step difference H2 and the principal surface 151 and also between the step-difference surface B2 and the principal surface 101. The resin film 190 thus connects the principal surface 151 and the principal surface 101 to each other with a gentle slope or a gentle slope portion.

Each circuit electrode 161C covers a surface of the resin film 190 that is opposite to the surface facing the principal surfaces 151 and 101. Note that a connection electrode 195 extends through the resin film 190, and the circuit electrode 161C is connected to the corresponding penetrating electrode 165 via the connection electrode 195.

A connection pad 180C is provided on a surface of the circuit electrode 161C that is opposite to the surface facing the principal surface 101, the step-difference surface B2, and the principal surface 151. More specifically, the connection pad 180C extends over the circuit electrode 161C and the resin film 190 so as to cover the slope surface that connects the structural body 150C to the first electronic component 100.

The second electronic component 200 is connected to the connection pads 180C with respective solder bumps 300 interposed therebetween.

Even in this configuration, the principal surface 101 and the principal surface 151 are disposed so as to have the step difference H2. In other words, each connection pad 180C can be larger compared with the case in which the principal surface 101 and the principal surface 151 are flush with each other, which can increase the connection area between each solder bump 300 and the connection pad 180C.

The resin film 190 covers corners (sharp corners) between the step-difference surface B2 of the portion of the step difference H2 and the principal surface 151 and also between the step-difference surface B1 and the principal surface 101, which prevents stress from concentrating in the solder bump 300. This can reduce or prevent the likelihood of breakage occurring inside the solder bump 300.

Due to thermal stress, forces may act between the structural body 150C and the second electronic component 200 so as to contract the second electronic component 200 in the direction perpendicular to the height direction with respect to the principal surface 151 of the structural body 150C. In this case, each solder bump 300 is pressed against the portion of the step difference H2. This can increase the connection strength between the connection pad 180C and the solder bump 300, which reduces or prevents the likelihood of breakage.

In addition, this can reduce or prevent an increase in the area of the multilayer body 10C when the side on which the second electronic component 200 is mounted is viewed in plan, in other words, when the principal surface 101 (the principal surface 151) is viewed in plan. This leads to a reduction in the size of the multilayer body 10C.

Fifth Preferred Embodiment

Figure 12:
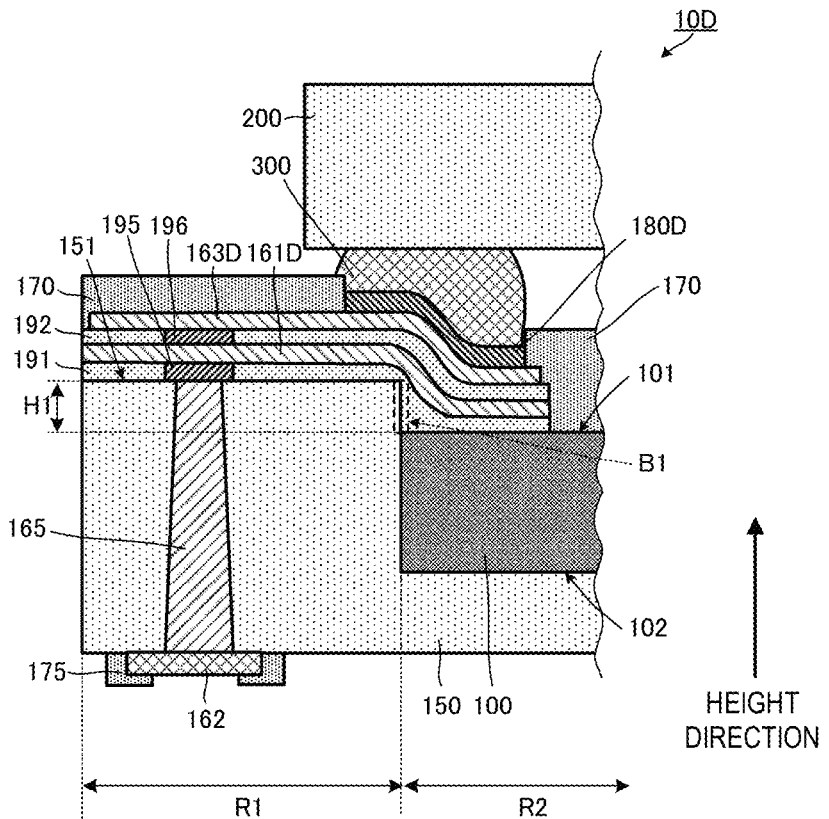
FIG. 12 is a cross-sectional side view illustrating a configuration of a multilayer body 10D according to a fifth preferred embodiment of the present invention.

Next, a multilayer body according to a fifth preferred embodiment of the present invention will be described with reference to the drawings. FIG. 12 is a cross-sectional side view illustrating a configuration of a multilayer body 10D according to the fifth preferred embodiment of the present invention. In FIG. 12, the relationship between vertical and horizontal dimensions is exaggerated and does not always reflect actual dimensions.

As illustrated in FIG. 12, the multilayer body 10D of the fifth preferred embodiment is different from the multilayer body 10 of the first preferred embodiment in that the multilayer body 10D includes resin films 191 and 192 and connection electrodes 195 and 196 and in that circuit electrodes 161D and 163D and connection pads 180D are shaped differently. Other basic configurations of the multilayer body 10D are the same as or similar to those of the multilayer body 10, and duplicated descriptions will be omitted.

As illustrated in FIG. 12, the multilayer body 10D includes the first electronic component 100, the structural body 150, the terminal electrodes 162, the circuit electrodes 161D and 163D, the penetrating electrodes 165, the solder resist layers 170 and 175, the connection pads 180D, the resin films 191 and 192, the connection electrodes 195 and 196, the second electronic component 200, and the solder bumps 300. The first electronic component 100 overlaps the second electronic component 200 as viewed in plan.

Each resin film 191 extends continuously on the principal surface 151, the step-difference surface B1, and the principal surface 101.

The resin film 191 crosses the portion of the step difference H1. More specifically, the resin film 191 covers corners (sharp corners) between the step-difference surface B1 of the portion of the step difference H1 and the principal surface 151 and also between the step-difference surface B1 and the principal surface 101. The resin film 191 thus connects the principal surface 151 and the principal surface 101 to each other with a gentle slope or a gentle slope-like portion.

Each circuit electrode 161D covers a surface of the resin film 191 that is opposite to the surface facing the principal surfaces 151 and 101. Note that a connection electrode 195 extends through the resin film 191, and the connection electrode 195 connects the circuit electrode 161D to the corresponding penetrating electrode 165.

A resin film 192 extends over the resin film 191 and the circuit electrode 161D so as to cover a surface of the circuit electrode 161D that is opposite to the surface in contact with the resin film 191. Similarly to the resin film 191, the resin film 192 extends continuously on the principal surface 151, the step-difference surface B1, and the principal surface 101.

In other words, the resin film 192 crosses the portion of the step difference H1. More specifically, the resin film 192 covers corners between the step-difference surface B1 of the portion of the step difference H1 and the principal surface 151 and also between the step-difference surface B1 and the principal surface 101. The resin film 192 thus connects the principal surface 151 and the principal surface 101 to each other with a gentle slope or a gentle slope-like portion.

Each circuit electrode 163D covers a surface of the resin film 192 that is opposite to the surface facing the circuit electrode 161D. A connection electrode 196 extends through the resin film 192, and the connection electrode 196 connects the circuit electrode 163D to the circuit electrode 161D.

A connection pad 180D is provided on a surface of each circuit electrode 163D that is opposite to the surface facing the principal surface 101, the step-difference surface B1, and the principal surface 151. More specifically, the connection pad 180D is formed over the circuit electrodes 161D and 163D and the resin films 191 and 192 so as to cover the slope surface that connects the structural body 150 to the first electronic component 100.

The second electronic component 200 is connected to the connection pads 180D with respective solder bumps 300 interposed therebetween.

Even in this configuration, the principal surface 101 and the principal surface 151 are disposed so as to have the step difference H1. In other words, each connection pad 180D can be larger compared with the case in which the principal surface 101 and the principal surface 151 are flush with each other, which can increase the connection area between each solder bump 300 and the connection pad 180D.

Multiple resin films 191 and 192 cover corners (sharp corners) between the step-difference surface B1 of the portion of the step difference H1 and the principal surface 151 and also between the step-difference surface B1 and the principal surface 101, which further reduces or prevents stress from concentrating in the solder bump 300 compared with the case of a single resin film covering the sharp corners. This can further reduce or prevent the likelihood of breakage occurring inside the solder bump 300.

In addition, the resin films 191 and 192 define and function as cushions in the multilayer body 10D, which can reduce or prevent the likelihood of breakage of the multilayer body 10D when the second electronic component 200 is mounted.

The multilayer body 10D has a structure in which the principal surface 101 is positioned below the principal surface 151, and the central region of the multilayer body 10D is recessed relative to the peripheral region thereof. Due to thermal stress, forces may act between the structural body 150 and the second electronic component 200 so as to expand the second electronic component 200 in the direction perpendicular or substantially perpendicular to the height direction with respect to the principal surface 151 of the structural body 150. In this case, each solder bump 300 is pressed against the step-difference surface B1 (the portion indicated by the step difference H1). This can increase the connection strength between the connection pad 180D and the solder bump 300, which reduces or prevents the likelihood of breakage.

In addition, this can reduce or prevent an increase in the area of the multilayer body 10D when the side on which the second electronic component 200 is mounted is viewed in plan, in other words, when the principal surface 101 (the principal surface 151) is viewed in plan. This leads to a reduction in the size of the multilayer body 10D.

Note that the multilayer body 10C of the fourth preferred embodiment may be also configured to include multiple resin films that cross the step-difference surface B1. In this case, advantageous effects similar to those of the present preferred embodiment can be obtained.

Sixth Preferred Embodiment

Figure 13:
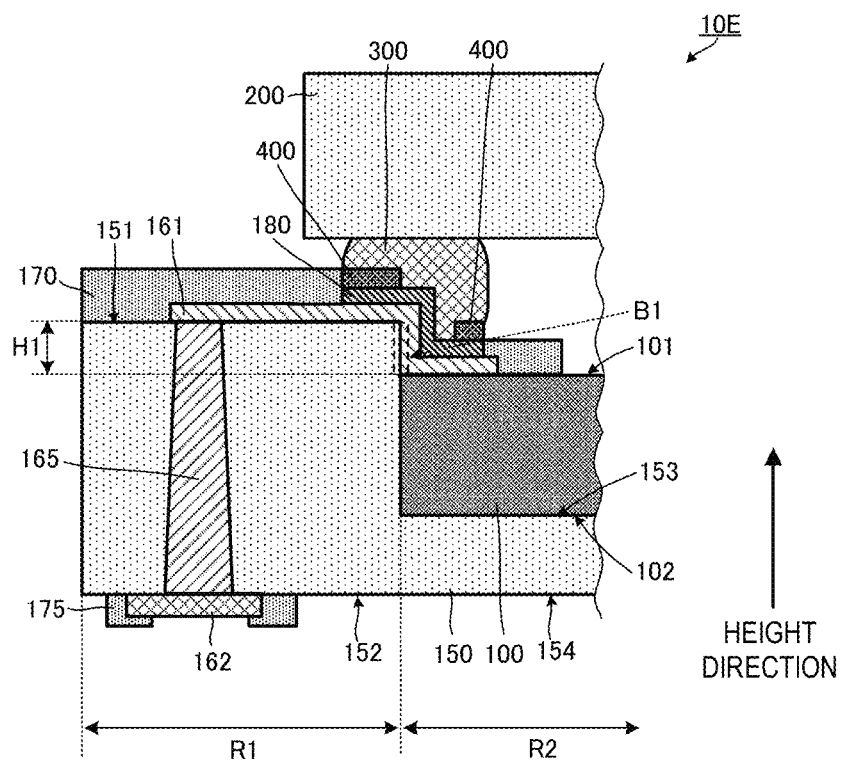
FIG. 13 is a cross-sectional side view illustrating a configuration of a multilayer body 10E according to a sixth preferred embodiment of the present invention.

Next, a multilayer body according to a sixth preferred embodiment of the present invention will be described with reference to the drawings. FIG. 13 is a cross-sectional side view illustrating a configuration of a multilayer body 10E according to the sixth preferred embodiment of the present invention. In FIG. 13, the relationship between vertical and horizontal dimensions is exaggerated and does not always reflect actual dimensions.

As illustrated in FIG. 13, the multilayer body 10E of the sixth preferred embodiment is different from the multilayer body 10 of the first preferred embodiment in that the multilayer body 10E includes multiple auxiliary members 400. Other basic configurations of the multilayer body 10E are the same as or similar to those of the multilayer body 10, and duplicated descriptions will be omitted.

As illustrated in FIG. 13, the auxiliary members 400 are provided on the surface of each connection pad 180 on which the second electronic component 200 is mounted. The auxiliary members 400 are preferably conductors. It is more preferable that the auxiliary members 400 are made of the same material as that of the connection pad 180. Accordingly, the auxiliary members 400 and the connection pad 180 have the same coefficient of linear expansion, which leads to a high reliability.

In this configuration, the auxiliary members 400 can further increase the connection area between the connection pad 180 and the solder bump 300.

The auxiliary members 400 may be located at any positions on the surface of the connection pad 180 that comes into contact with the solder bump 300. In other words, it is not necessary to specifically limit the positions at which the auxiliary members 400 are disposed insofar as the auxiliary members 400 are provided on the outer surface of the connection pad 180 (the surface opposite to the surface facing the circuit electrode 161) so as to generate step-difference portions to be in contact with the solder bump 300. Although two auxiliary members 400 are exemplified in the present preferred embodiment, one auxiliary member 400 or more than two auxiliary members 400 may be provided. Moreover, any number of the auxiliary members 400 may be provided insofar as the auxiliary members 400 do not have an adverse effect on the connection between the connection pad 180 and the solder bump 300.

As described above, forming multiple auxiliary members 400 results in an increase in the connection area. Alternatively, roughening the outer surface of the connection pad 180 can provide the same or substantially the same advantageous effects. The solder bump 300 thus enters the roughened portion of the outer surface of the connection pad 180, which increases the connection area, and improves the connection strength, between the connection pad 180 and the solder bump 300.

Note that in the height direction, the step difference H1 is preferably greater than the thickness of the connection pad 180 at a position where the outer surface is most roughened. This can greatly increase the connection strength between the connection pad 180 and the solder bump 300.

Seventh Preferred Embodiment

Figure 14A:
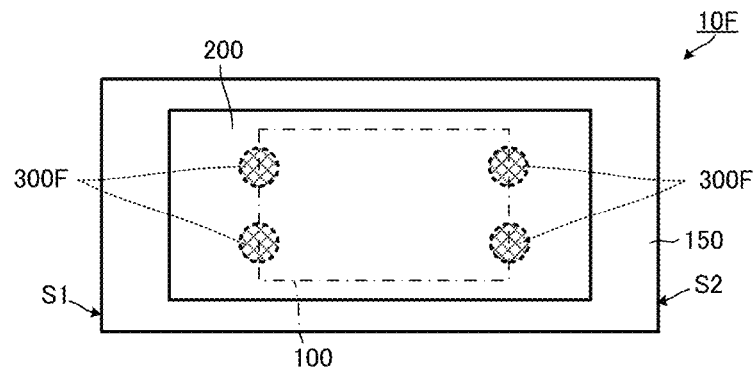
FIGS. 14A to 14C are plan views illustrating multilayer bodies according to a seventh preferred embodiment of the present invention when outer surfaces thereof are viewed.
Figure 14B:
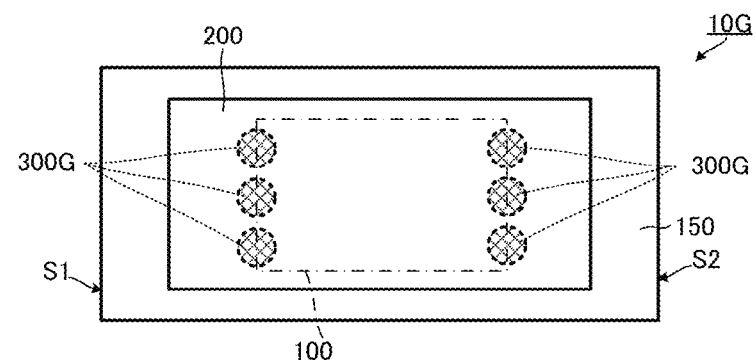
Figure 14C:
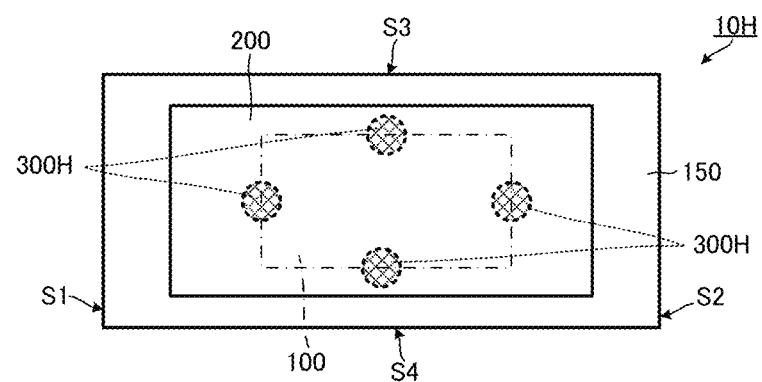

Next, multilayer bodies according to a seventh preferred embodiment of the present invention will be described with reference to the drawings. FIGS. 14A to 14C are plan views illustrating multilayer bodies according to the seventh preferred embodiment of the present invention when the outer surfaces thereof are viewed. In FIGS. 14A to 14C, the relationship between vertical and horizontal dimensions may be exaggerated and may not always reflect actual dimensions. FIGS. 14A to 14C focus solely on solder bumps 300, and other configurations are not illustrated. The first electronic component 100 overlaps the second electronic component 200 as viewed in plan.

As illustrated in FIG. 14A, a multilayer body 10F according to the seventh preferred embodiment is different from the multilayer body 10 of the first preferred embodiment in that two solder bumps 300F are provided near the first side surface S1 and another two solder bumps 300F are provided near the second side surface S2. In addition, two connection pads 180 are provided near the first side surface S1 and another two connection pads 180 are provided near the second side surface S2, and these connection pads 180 are connected to respective solder bumps 300F. Other basic configurations of the multilayer body 10F are the same as or similar to those of the multilayer body 10, and duplicated descriptions will be omitted.

The connection area between the connection pads 180 and the solder bumps 300F can also be increased with this configuration. Moreover, each portion of the step difference H1 extends in the height direction of the multilayer body 10F, which does not increase the area of the multilayer body 10F as viewed in plan. This leads to a reduction in the size of the multilayer body 10F.

As illustrated in FIG. 14B, a multilayer body 10G according to the seventh preferred embodiment is different from the multilayer body 10 of the first preferred embodiment in that three solder bumps 300G are provided near the first side surface S1 and another three solder bumps 300G are provided near the second side surface S2. In addition, three connection pads 180 are provided near the first side surface S1 and another three connection pads 180 are provided near the second side surface S2, and these connection pads 180 are connected to respective solder bumps 300G. Other basic configurations of the multilayer body 10G are the same as or similar to those of the multilayer body 10, and duplicated descriptions will be omitted.

The connection area between the connection pads 180 and the solder bumps 300G can also be increased with this configuration. Moreover, each portion of the step difference H1 extends in the height direction of the multilayer body 10G, which does not increase the area of the multilayer body 10G as viewed in plan. This leads to a reduction in the size of the multilayer body 10G.

As illustrated in FIG. 14C, a multilayer body 10H according to the seventh preferred embodiment is different from the multilayer body 10 of the first preferred embodiment in that a solder bump 300H is provided at respective positions near the first side surface S1, the second side surface S2, a third side surface S3, and a fourth side surface S4. The third side surface S3 and the fourth side surface S4 are side surfaces of the multilayer body 10H that are opposite to each other and that extend in the direction of connecting the first side surface S1 and the second side surface S2 to each other.

More specifically, multiple step-difference surfaces B1 are provided between the first electronic component 100 and the structural body 150. A connection pad 180 crosses the step-difference surface B1 (not illustrated) positioned near the first side surface S1, and another connection pad 180 crosses the step-difference surface B1 (not illustrated) positioned near the second side surface S2. Two solder bumps 300H are connected to these two connection pads 180, respectively. Note that the above step-difference surfaces B1 near the first side surface S1 and near the second side surface S2 correspond to "first step-difference surfaces".

In addition, of multiple step-difference surfaces B1 between the first electronic component 100 and the structural body 150, a connection pad 180 crosses the step-difference surface B1 (not illustrated) positioned near the third side surface S3, and another connection pad 180 crosses the step-difference surface B1 (not illustrated) positioned near the fourth side surface S4. Two solder bumps 300H are connected to these two connection pads 180, respectively. Note that the above step-difference surfaces B1 near the third side surface S3 and near the fourth side surface S4 correspond to "second step-difference surfaces". Other basic configurations of the multilayer body 10H are the same as or similar to those of the multilayer body 10, and duplicated descriptions will be omitted.

The connection area between the connection pads 180 and the solder bumps 300H can also be increased with this configuration. Moreover, each portion of the step difference H1 extends in the height direction of the multilayer body 10H, which does not increase the area of the multilayer body 10H as viewed in plan. This leads to a reduction in the size of the multilayer body 10H.

Furthermore, with this configuration, two solder bumps 300H are respectively disposed near the first and second side surfaces S1 and S2, and the connection pads 180 are connected to these solder bumps 300H. This can increase the connection strength against the stress applied in the direction of connecting the first and second side surfaces S1 and S2 to each other. In addition, the other two solder bumps 300H are respectively disposed near the third and fourth side surfaces S3 and S4, and the connection pads 180 are connected to these solder bumps 300H. This can increase the connection strength against the stress applied in the direction parallel to the first and second side surfaces S1 and S2. Accordingly, even in the case of stresses acting in different directions, this can improve the connection strength between the second electronic component 200 and the first electronic component 100 and also between the second electronic component 200 and the structural body 150, which can further improve the connection strength of the multilayer body 10H.

Note that each of the multilayer bodies 10F to 10H according to the seventh preferred embodiment includes multiple connection pads 180. This enables the second electronic component 200 to be readily fixed to the first electronic component 100 and to the structural body 150, which further improves the connection strength for the multilayer bodies 10F to 10H.

In the above configurations, the principal surface 101 of the first electronic component 100 is exposed. However, the principal surface 101 of the first electronic component 100 may be covered with the solder resist layer 170. With this configuration, the principal surface 101 can remain unexposed, which leads to a cost reduction in manufacturing the multilayer bodies 10 to 10H.

Eighth Preferred Embodiment

Figure 15A:
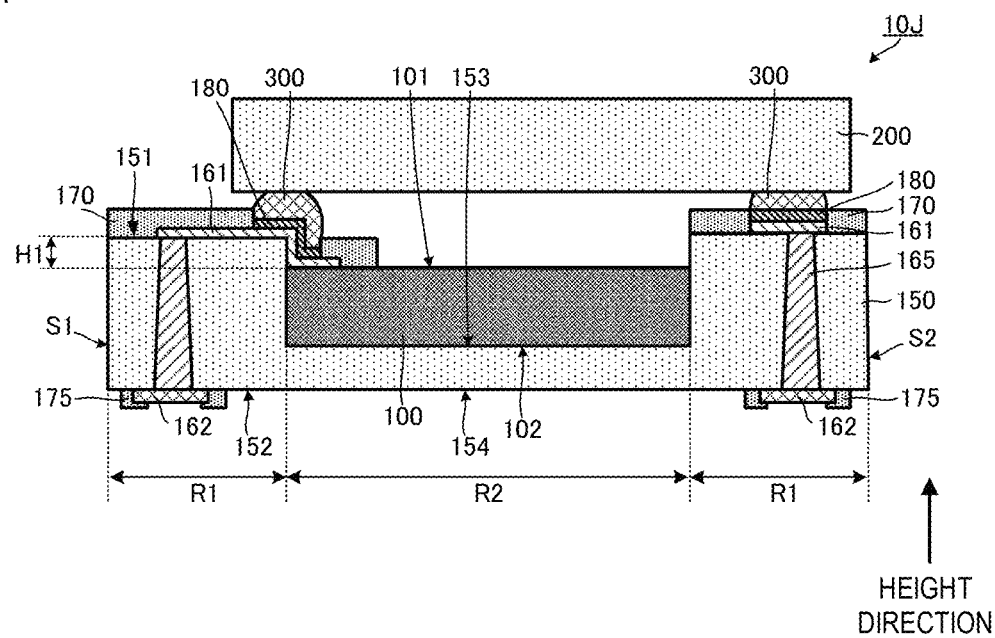
FIG. 15A is a cross-sectional side view illustrating a configuration of a multilayer body 10J according to an eighth preferred embodiment of the present invention.
Figure 15B:
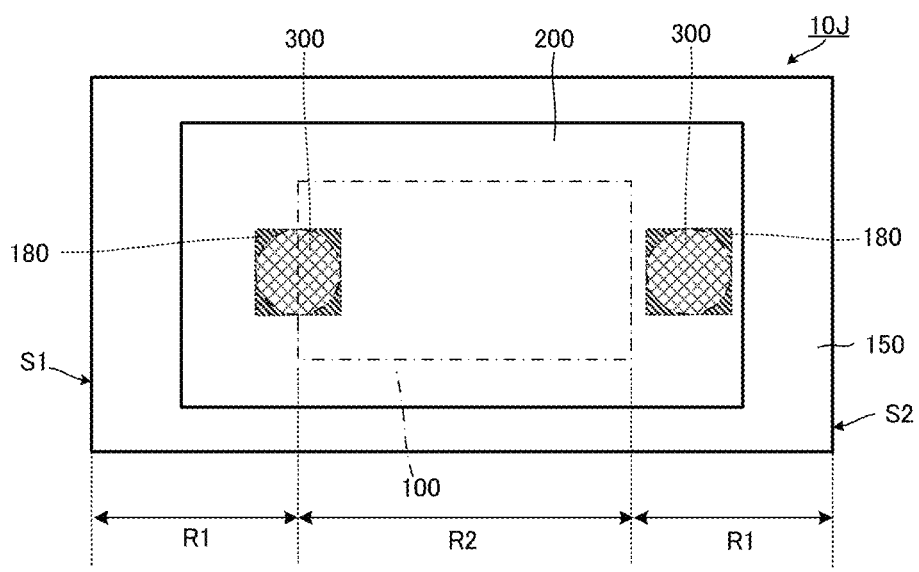
FIG. 15B is a plan view illustrating the multilayer body 10J according to the eighth preferred embodiment when an outer surface thereof is viewed.

Next, a multilayer body according to an eighth preferred embodiment of the present invention will be described with reference to the drawings. FIG. 15A is a cross-sectional side view illustrating a configuration of a multilayer body 10J according to the eighth preferred embodiment of the present invention, and FIG. 15B is a plan view illustrating the multilayer body 10J according to the eighth preferred embodiment when the outer surface thereof is viewed. In FIGS. 15A and 15b, the relationship between vertical and horizontal dimensions may be exaggerated and may not always reflect actual dimensions.

As illustrated in FIGS. 15A and 15B, the multilayer body 10J of the eighth preferred embodiment is different from the multilayer body 10 of the first preferred embodiment in that a single portion of the step difference H1 is provided in the multilayer body 10J. Other basic configurations of the multilayer body 10J are the same as or similar to those of the multilayer body 10, and duplicated descriptions will be omitted.

As illustrated in FIG. 15A, only one portion of the step difference H1 is provided in the multilayer body 10J (on the left side of FIG. 15A). A penetrating electrode 165 is disposed in a portion where the portion of the step difference H1 is not provided (on the right side of FIG. 15A). The penetrating electrode 165 is connected to the second electronic component 200 via the circuit electrode 161, the connection pad 180, and the solder bump 300 that extend parallel or substantially parallel to the principal surface 151.

Even in this configuration, the principal surface 101 and the principal surface 151 are disposed so as to have the step difference H1. Providing at least one portion of the step difference H1 can increase the area of the connection pad 180 approximately to the extent of the area of the step-difference surface B1 compared with the case in which the principal surface 101 and the principal surface 151 are flush with each other. This can increase the connection area between the connection pad 180 and the solder bump 300.

Due to thermal stress, forces may act between the structural body 150 and the second electronic component 200 so as to expand the second electronic component 200 in the direction perpendicular or substantially perpendicular to the height direction with respect to the principal surface 151 of the structural body 150. In other words, forces may act in the second electronic component 200 in directions from the center of the multilayer body 10J toward the peripheral region. In this case, the solder bump 300 is pressed against the step-difference surface B1 (a portion indicated by the step difference H1) and also against the portion of the connection pad 180 that is in contact with the step-difference surface B1. This can increase the connection strength between the connection pad 180 and the solder bump 300, which reduces or prevents the likelihood of breakage.

The present invention is not limited to the preferred embodiments described above, and the configurations of the preferred embodiments described may be combined with or replaced by one another.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer body comprising:
   a first electronic component;
   a structural body including a first region and a second region, the first electronic component being in the second region; and
   a second electronic component mounted via a solder bump onto the structural body with a connection pad interposed therebetween; wherein
   an outer surface of the first region and an outer surface of the second region have a step difference therebetween in a height direction of the structural body; and
   the connection pad is on the outer surface of the first region, the outer surface of the first electronic component, and a step-difference surface of a portion of the step difference.

2. The multilayer body according to claim 1, wherein the outer surface of the first region is higher than the outer surface of the second region in the height direction of the structural body.

3. The multilayer body according to claim 1, wherein the outer surface of the first region is lower than the outer surface of the second region in the height direction of the structural body.

4. The multilayer body according to claim 1, wherein a resin film is between the portion of the step difference and the connection pad.

5. The multilayer body according to claim 4, wherein the resin film includes multiple layers that are laminated.

6. The multilayer body according to claim 1, wherein the connection pad includes a plurality of auxiliary structures provided thereon.

7. The multilayer body according to claim 1, wherein
   the multilayer body includes a plurality of the connection pads on the outer surface of the first region, the outer surface of the second region, and the step-difference surface; and
   the first electronic component is mounted onto the structural body with the plurality of the connection pads interposed therebetween.

8. The multilayer body according to claim 7, wherein
   the multilayer body includes a plurality of the step-difference surfaces;
   the structural body includes a first side surface and a second side surface opposite to each other;
   the structural body includes a third side surface and a fourth side surface opposite to each other and extending in a direction connecting the first side surface and the second side surface to each other;
   the plurality of the step-difference surfaces includes a first step-difference surface at at least one of a position at or adjacent to the first side surface and a position at or adjacent to the second side surface, and a second step-difference surface at at least one of a position at or adjacent to the third side surface and a position at or adjacent to the fourth side surface; and
   the connection pads are on the first step-difference surface, the second step-difference surface or both of the first step-difference surface and the second step-difference surface.

9. The multilayer body according to claim 1, wherein the structural body is made of resin.

10. The multilayer body according to claim 1, wherein each of the first and second electronic components is an IC device including a semiconductor or a surface acoustic wave device including a piezoelectric substrate.

11. The multilayer body according to claim 1, further comprising:
    a circuit electrode on the outer surface of the structural body;
    a terminal electrode on another surface of the structural body opposite to the outer surface; and
    at least one penetrating electrode in the structural body electrically connecting the circuit electrode to the terminal electrode.

12. The multilayer body according to claim 11, wherein the circuit electrode crosses the step-difference surface.

13. The multilayer body according to claim 11, wherein the connection pad is on a surface of the circuit element.

14. The multilayer body according to claim 1, wherein the solder bump straddles the first and second regions of the structural body.

15. The multilayer body according to claim 4, wherein the resin film covers a corner between the step-difference surface and the outer surface structural body, and a corner between the step-difference surface and the outer surface of the first electronic component.

16. The multilayer body according to claim 4, wherein the resin film include a slope portion.

* * * * *